US006890823B2

(12) United States Patent
Lee et al.

(10) Patent No.: US 6,890,823 B2
(45) Date of Patent: May 10, 2005

(54) METHODS OF FORMING INTEGRATED CIRCUITS WITH THERMAL OXIDE LAYERS ON SIDE WALLS OF GATE ELECTRODES WHEREIN THE SOURCE AND DRAIN ARE HIGHER THAN THE GATE ELECTRODE

(75) Inventors: Byeong-chan Lee, Gyeonggi-do (KR); Si-young Choi, Gyeonggi-do (KR); Chul-sung Kim, Gyeonggi-do (KR); Jong-ryeol Yoo, Gyeonggi-do (KR); Deok-hyung Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 4 days.

(21) Appl. No.: 10/426,562

(22) Filed: Apr. 30, 2003

(65) Prior Publication Data

US 2004/0043595 A1 Mar. 4, 2004

(30) Foreign Application Priority Data

Aug. 27, 2002 (KR) .................................. 10-2002-0050804

(51) Int. Cl.$^7$ .................. H01L 21/336; H01L 21/4763; H01L 21/3205; H01L 21/44
(52) U.S. Cl. ...................... 438/300; 438/311; 438/664; 438/682; 438/592; 257/408
(58) Field of Search .................. 438/300, 663, 438/683, 692, 592; 257/400, 408, 66, 347

(56) References Cited

U.S. PATENT DOCUMENTS

| 5,200,352 | A | * | 4/1993 | Pfiester .................. 438/231 |
| 5,508,541 | A | * | 4/1996 | Hieda et al. ............ 257/301 |
| 6,211,026 | B1 | * | 4/2001 | Ahmad et al. .......... 438/300 |
| 6,274,445 | B1 | * | 8/2001 | Nouri ...................... 438/300 |
| 6,281,085 | B1 | * | 8/2001 | Yeo ......................... 438/303 |
| 6,413,829 | B1 | * | 7/2002 | Yu ........................... 438/311 |
| 6,455,366 | B1 | * | 9/2002 | Lee .......................... 438/241 |
| 6,521,955 | B1 | * | 2/2003 | Ida et al. ................. 257/382 |

* cited by examiner

*Primary Examiner*—John F. Niebling
*Assistant Examiner*—Ron Pompey
(74) *Attorney, Agent, or Firm*—Myers Bigel Sibley & Sajovec

(57) ABSTRACT

Methods of forming thermal oxide layers on a side wall of gate electrodes are disclosed. In particular, thermal oxide layers can be formed on a side wall of a gate electrode by forming a gate electrode on an integrated circuit substrate and forming a thermal oxide layer on a side wall of the gate electrode using a thermal oxidation process. A silicide layer can be formed on the gate electrode after the formation of the thermal oxide layer.

30 Claims, 10 Drawing Sheets

METHODS OF FORMING INTEGRATED CIRCUITS WITH THERMAL OXIDE LAYERS ON SIDE WALLS OF GATE ELECTRODES WHEREIN THE SOURCE AND DRAIN ARE HIGHER THAN THE GATE ELECTRODE

RELATED APPLICATION

This application claims the benefit of Korean Patent Application No. 2002-50804, filed Aug. 27, 2002, the disclosure of which is hereby incorporated herein by reference in its entirety as if set forth fully herein.

FIELD OF THE INVENTION

The present invention relates to methods of fabricating integrated circuit devices and, more particularly, to methods of forming integrated circuit devices having a metal silicide layer.

BACKGROUND

A typical MOS transistor includes a source/drain region, a channel region disposed between the source region and the drain region, and a gate electrode disposed over the channel region. The resistance of the gate electrode can be closely related to the speed of the MOS transistor. Namely, the less the resistance of the gate electrode is, the higher the operation speed of the MOS transistor may become. Usually, the gate electrode is made of doped polysilicon and tungsten silicide which are sequentially stacked. Because the tungsten silicide can have lower resistance than the doped polysilicon, the resistance of the gate electrode can be lowered. As integrated circuits become more highly integrated, there may be a demand for materials having lower resistance than tungsten silicide.

It is known to provide a metal silicide, such as cobalt silicide, titanium silicide or nickel silicide to provide lower resistance. However, the metal silicide may be deteriorated by a gate thermal oxidation process performed after forming the gate electrode. The gate thermal oxidation process is a thermal process for curing both sidewalls (particularly, lower sidewalls adjacent to the substrate) and an active region surface, which may be damaged during an etching process for forming the gate electrode. The gate thermal oxidation process may adversely affect the characteristics of the metal silicide thereby increasing the resistance of the metal silicide.

SUMMARY

Embodiments according to the present invention can provide methods of forming integrated circuit devices including thermal oxide layers on side walls of gate electrodes. Pursuant to these embodiments, a gate electrode can be formed on an integrated circuit substrate. A thermal oxide layer can be formed on a side wall of the gate electrode using a thermal oxidation process. After formation of the thermal oxide layer, a silicide layer can be formed on the gate electrode. Forming the silicide layer after the thermal process used to form the thermal oxide layer may help avoid a reduction in conductivity of the silicide layer that could be caused by the thermal process.

In some embodiments according to the invention, the step of forming a silicide layer can be preceded by forming a spacer on the thermal oxide layer so that the thermal oxide layer is between the side wall and the spacer. In some embodiments according to the invention, a source/drain region associated with the gate electrode can be formed. A conductive layer can be formed on the source/drain region to provide a raised source/drain conductive layer above the source/drain region. The conductive raised layer can be silicided to provide a raised silicide layer on the source/drain region.

In some embodiments according to the invention, a barrier layer can be removed from the gate electrode to expose a surface of the gate electrode at a level below the raised conductive layer. The exposed surface of the gate electrode can be silicided to form the raised silicide layer on the gate electrode. In some embodiments according to the invention, the raised silicide layer is a first raised silicide layer in a cell region of the integrated circuit device. A second silicide layer can be formed on a source/drain region associated with a gate electrode in a peripheral region of the integrated circuit device.

In some embodiments according to the invention, A capping layer can be formed on the raised silicide layer on the gate electrode to a level about equal to the level of the raised silicide layer on the source/drain region. In some embodiments according to the invention, a source/drain region associated with the gate electrode can be formed. A conductive layer can be formed on the source/drain region to provide a raised source/drain conductive layer above the source/drain region. The gate electrode, the raised source/drain conductive layer and the thermal oxide layer can be planarized. The conductive raised layer can be silicided to provide a raised silicide layer on the source/drain region.

In some embodiments according to the invention, a gate insulating layer can be formed on the substrate beneath the gate electrode, wherein the gate insulating layer extends beyond the side wall to provide a step surface of the gate insulating layer that faces opposite the substrate. The thermal oxide layer can be formed on the side wall and on the step surface.

According to an aspect of the present invention, a method of forming a semiconductor device having a metal silicide layer is provided. The method comprises forming a device isolation layer at a semiconductor substrate to define an active region. A gate pattern is formed to cross over the active region. The gate pattern includes a gate insulating layer, a gate electrode, and a stack barrier layer which are sequentially stacked. A gate thermal oxide layer is formed on both sidewalls of the gate electrode. A spacer is formed on both sidewalls of a gate pattern having the gate thermal oxide layer. An epitaxial layer is formed on active regions adjacent to opposite sides of a gate pattern having the spacer. The epitaxial layer is even with or higher than a top surface of the stack barrier layer. The stack barrier layer is etched to expose a top surface of the gate electrode. A metal silicide layer is formed at the exposed gate electrode and the epitaxial layer. The stack barrier layer serves to prevent formation of the epitaxial layer on the gate electrode. The stack barrier layer is made of a material having an etch selectivity with respect to the gate electrode.

More specifically, a method of forming the metal silicide layer includes forming a metal layer on an entire surface of a semiconductor substrate including top surfaces of the epitaxial layer and the exposed gate electrode. A semiconductor substrate including the metal layer is silicided to a metal silicide layer on the epitaxial layer and the exposed gate electrode. By means of an etch, the metal layer is then removed. Preferably, the metal layer is made of at least one selected from the group consisting of cobalt (Co), titanium (Ti), and nickel (Ni).

According to another aspect of the present invention, a method of forming a semiconductor device having a metal silicide layer is provided. The method comprises preparing a semiconductor substrate where a cell region having a first active region and a peripheral circuit region having a second active region are formed. A first gate pattern and a second gate pattern are formed to cross over the first active region and the second active region, respectively. The first gate pattern includes a first gate insulating layer, a first gate electrode, and a first stack barrier layer which are sequentially stacked. The second gate pattern includes a second gate insulating layer, a second gate electrode, and a second stack barrier layer which are sequentially stacked. A gate thermal oxide layer is formed on both sidewalls of the first and second gate electrodes. A spacer is formed on both sidewalls of first and second gate patterns each having the gate thermal oxide layer. An epitaxial layer is formed on the first active region adjacent to opposite sides of the first gate pattern having the spacer. The epitaxial layer is even with or higher than a top surface of the first stack barrier layer.

An interlayer dielectric is formed on an entire surface of a semiconductor substrate including the epitaxial layer. The interlayer dielectric and the first and second gate stack barrier layers are etched to expose the epitaxial layer and the first and second gate electrodes. A metal silicide layer is formed on the exposed epitaxial layer and the exposed first and second gate electrodes. The first and second stack barrier layers serve to prevent formation of the epitaxial layer on the first and second gate electrodes, respectively. The first and second stack barrier layers are made of a material having an etch selectivity with respect to the first and second gate electrodes.

DESCRIPTION OF EMBODIMENTS ACCORDING TO THE INVENTION

Figure 1:
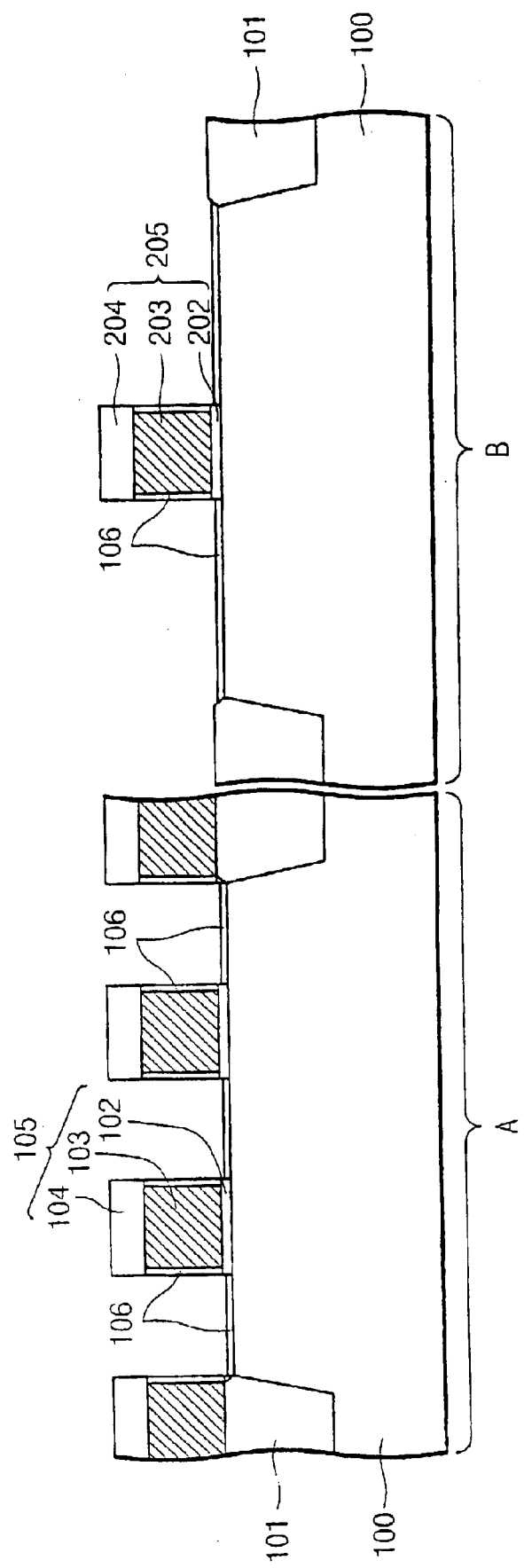
FIG. 1 through FIG. 10 are cross-sectional views illustrating method embodiments of forming integrated circuit devices according to the invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element Such as a layer, region or substrate is referred to as being "on" another element, it can be directly on the other element or intervening elements may also be present. It will be understood that when an element such as a layer, region or substrate is referred to as "under" another element, it can be directly under the other element or intervening elements may also be present. It will be understood that when part of an element, such as surface of a conductive line, is referred to as "outer," it is closer to the outside of the integrated circuit than other parts of the element. Like numbers refer to like elements throughout.

Furthermore, relative terms, such as beneath, may be used herein to describe one layer's or region's relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Method embodiments of forming integrated circuit devices according to the invention are described below with reference to FIG. 1 through FIG. 8, in which a reference designator "A" denotes a cell region and reference designator "B" denotes a peripheral circuit region.

Referring to FIG. 1, a device isolation layer 101 is formed on an integrated circuit substrate 100 having a cell region "A" and a peripheral circuit region "B" to define a first active region in the cell region "A" and a second active region in the peripheral circuit region "B". In the cell region "A", typical DRAM cells may be arrayed. The device isolation layer 101 may be a trench isolation layer. A first gate pattern 105 and a second gate pattern 205 are formed across the first and second active regions, respectively. The first gate pattern 105 includes a first gate insulating layer 102, a first gate electrode 103, and a first stack barrier layer 104, which are sequentially formed on the integrated circuit substrate 100. The second gate pattern 205 includes a second gate insulating layer 202, a second gate electrode 203, and a second stack barrier layer 204, which are sequentially formed on the integrated circuit substrate 100. The first and second gate insulating layers 102 and 202 may be made of thermal oxide. Preferably, the first and second gate electrodes are made of a conductive material such as, for example, doped polysilicon. The doped polysilicon layers may be formed in an in-situ manner, using $POCl_3$ doping, or using ion implantation. The first and second stack barrier layers 104 and 204 are formed of a material having an etch selectivity with respect to the first and second gate electrodes 103 and 203.

In some embodiments according to the invention, a portion of the integrated circuit substrate 100 including the first and second gate patterns is subjected to a gate thermal oxidation process, forming a gate thermal oxide layer 106 on side walls of the first and second gate electrodes 103 and 203. In some embodiments according to the invention, the gate thermal oxide layer 106 is formed on surfaces of the first and second active regions adjacent to opposite sides of the first and second gate patterns 105 and 205 as shown. In other embodiments according to the invention, extensions of the first and second gate insulating layers 102 and 202 may be formed on the surfaces of the first and second active regions adjacent to opposite sides of the first and second gate patterns 105 and 205.

Figure 2:
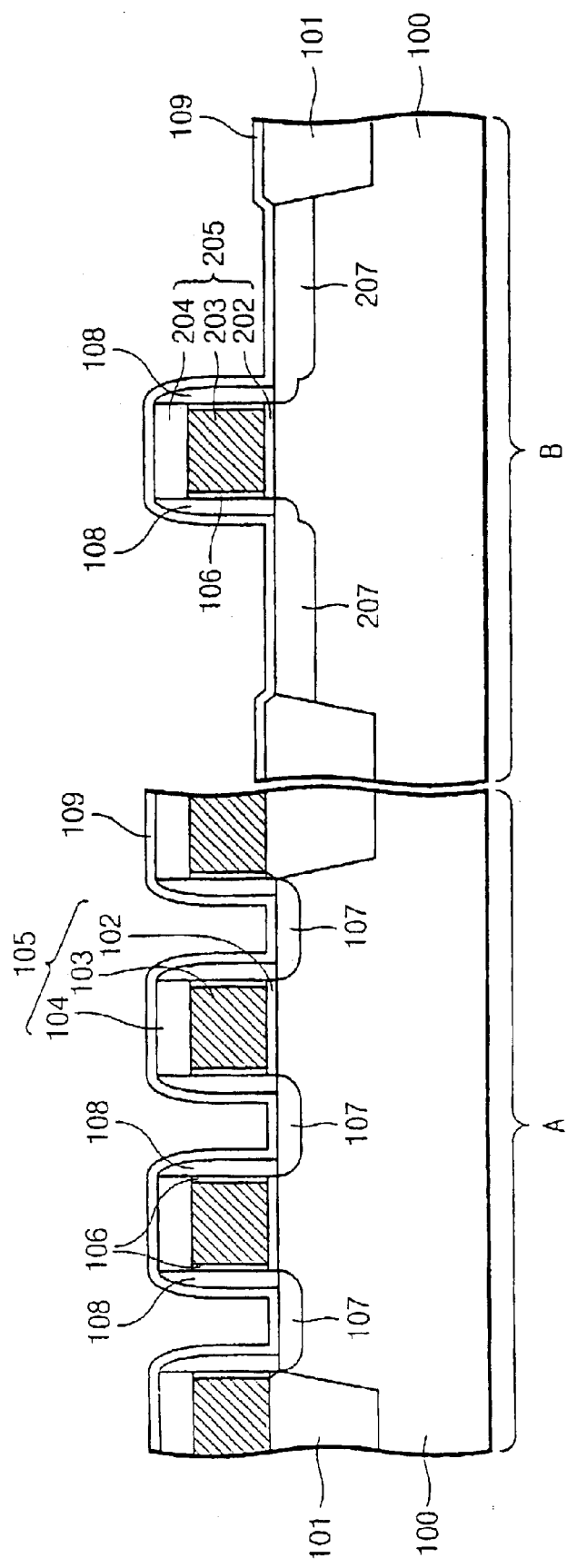

Referring to FIG. 2, using the first gate pattern 105 with the gate thermal oxide layer 106 as a mask, an ion implanting process is performed to form a first impurity diffusion layer (or source/drain region) 107 at a first active region adjacent to opposite sides of the first gate pattern 105. A spacer 108 is formed on both sidewalls of the first and second gate patterns 105 and 205 so that the gate thermal oxide layer 106 is located between the side wall of the gate patterns 105 and 205 and the spacer 108. A second impurity diffusion layer (or source/drain region) 207 is formed at a second active region adjacent to opposite sides of the second gate pattern 205. In some embodiments according to the invention, the second impurity diffusion layer 207 has a lightly doped drain (LDD) structure. For example, although not shown in FIG. 2, following formation of the spacer 108, another ion implantation process may be performed so that the first impurity diffusion layer 107 may have the LDD structure. It will be understood that the first and second impurity diffusion layers 107 and 207 may be simultaneously or sequentially formed. As discussed briefly above, in some embodiments according to the invention, the first impurity diffusion layer 107 corresponds to a source/drain region of a cell transistor, and the second impurity diffusion layer 207 corresponds to a source/drain region of a peripheral circuit transistor. In some embodiments according to the invention, the gate thermal oxide layer 106 on the first and second active regions of the substrate is removed using an etch process before forming the first and second impurity diffusion layers 107 and 207. In other embodiments according to the invention.

Referring still to FIG. 2, a silicide barrier layer 109 is conformally deposited on a surface of an integrated circuit substrate 100 including the first and second impurity diffusion layers 107 and 207. The silicide barrier layer 109 can prevent formation of a typical metal silicide layer on surfaces of the first and second active regions. In some embodiments according to the invention, the silicide barrier layer 109 is a material having an etch selectivity with respect to the first and second stack barrier layers 104 and 204 and the spacer 108.

Figure 3:
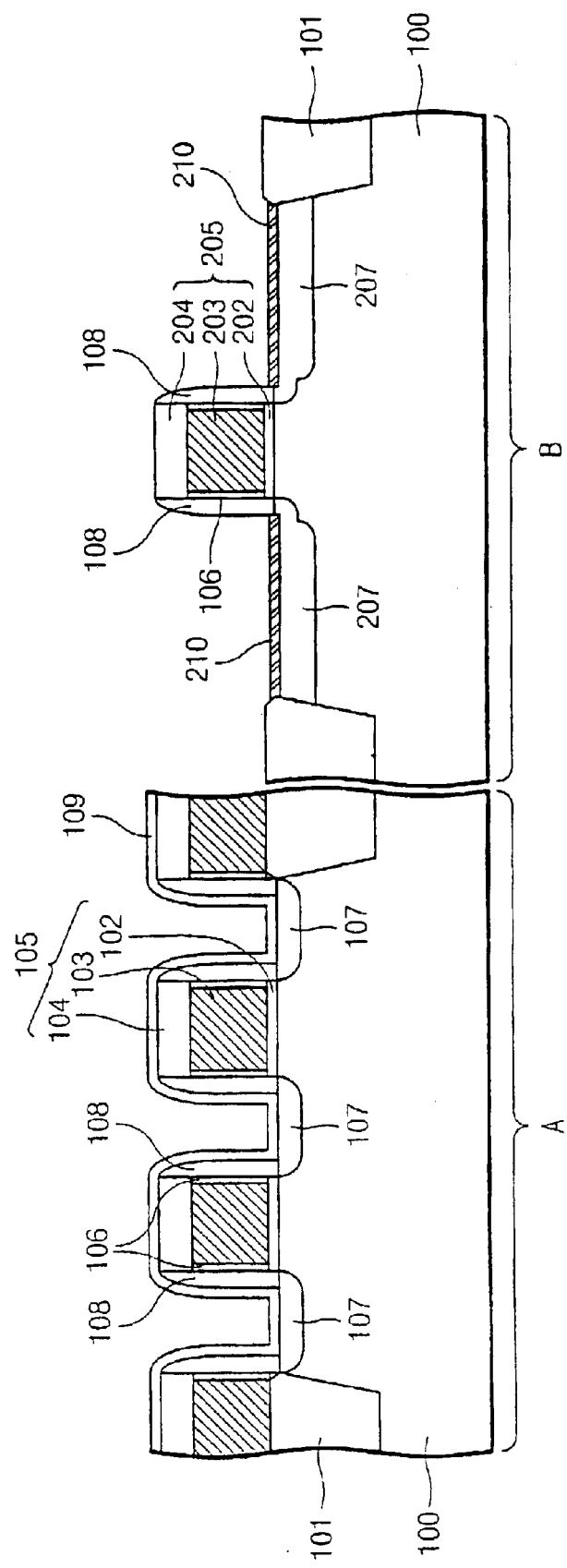

As shown in FIG. 3, the silicide barrier layer 109 is selectively etched to remove the silicide barrier layer 109 on the peripheral circuit region "B" to expose a surface of the second impurity diffusion layer 207. An ohmic layer 210 is formed on an exposed surface of the second impurity diffusion layer 207. The ohmic layer 210 is preferably made of metal silicide. In some embodiments according to the invention, the metal silicide layer is made of a material selected from the group consisting of cobalt silicide ($CoSi_x$), titanium silicide ($TiSi_x$), and nickel silicide ($NiSi_x$). Due to the silicide barrier layer 109, the ohmic layer 210 is not formed on a surface of the first impurity diffusion layer 107 in the cell region "A".

Figure 4:
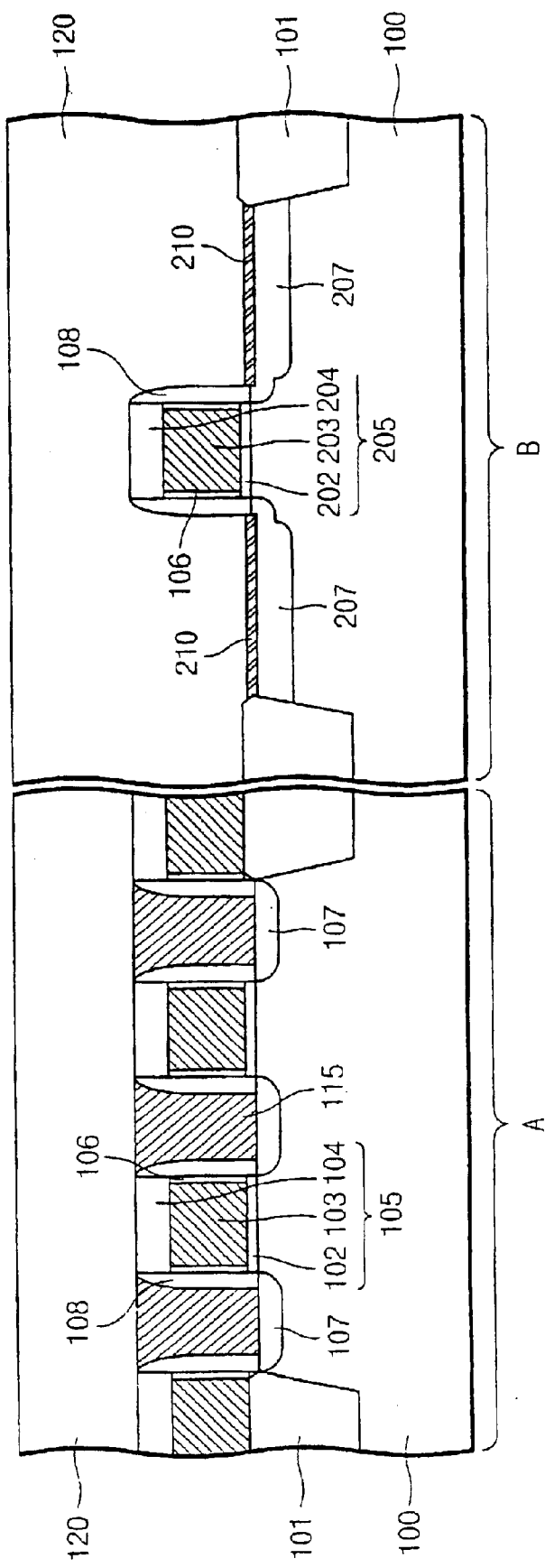

According to FIG. 4, the silicide barrier layer 109 formed in the cell region "A" is removed by an etch process to expose the first impurity diffusion layer 107. A pad (or raised source/drain layer) is formed on the exposed first impurity diffusion layer 107. The pad can provide a buffer to reduce a step difference between surfaces of the first impurity diffusion layer 107 and the first gate pattern 105. In some embodiments according to the invention, the pad (or raised source/drain layer) 115 is an epitaxial layer 115 formed, for example, by selective epitaxial growth (SEG). That is, the epitaxial layer 115 can be formed from the surface of the first impurity diffusion layer 107 by means of an epitaxial growth process so that the epitaxial layer has the same single crystalline silicon structure as the integrated circuit substrate 100. In some embodiments according to the invention, the epitaxial layer 115 is formed to a level that is equal to a top surface of the first stack barrier layer 104. In some embodiments according to the invention, the epitaxial layer 115 (or raised source/drain region) is formed to a level that is greater than the top surface of the first stack barrier layer 104. The epitaxial layer 115 is doped with impurities having the same type as the impurities in the first impurity diffusion layer 107. For example, when the first impurity diffusion layer 107 is doped with N-type impurities, the epitaxial layer 115 is also doped with N-type impurities.

The first and second stack barrier layers 104 and 204 and the spacer 108 are made of a material to inhibit formation of the epitaxial layer 115. That is, the first and second stack barrier layers 104 and 204 are preferably made of a material having an etch selectivity with respect to the first and second gate electrodes 103 and 203 to inhibit the formation of the epitaxial layer 115 thereon. In some embodiments according to the invention, the first and second stack barrier layers 104 and 204 are made of silicon nitride or silicon oxide. The spacer 108 is made of a material to inhibit formation of the epitaxial layer 115 on sidewalls of the first gate electrode 103. In some embodiments according to the invention, the spacer 108 is made of the same material as the first and second stack barrier layers 104 and 204.

When the first and second stack barrier layers 104 and 204 and the spacer 108 are made of silicon nitride, the silicide barrier layer 109 is preferably made of silicon oxide. In other embodiments according to the invention, if the first and second stack barrier layers 104 and 204 and the spacer 108 are made silicon oxide, the silicide barrier layer 109 may be made of silicon nitride.

In some embodiments according to the invention, the ohmic layer 210 can inhibit formation of the epitaxial layer on the second impurity diffusion layer 207. In other embodiments according to the invention, formation of the epitaxial layer 115 can be inhibited by forming an epitaxial barrier layer (not shown) on a surface of the integrated circuit substrate, which is selectively etched to expose the cell region "A". The epitaxial layer is formed on the exposed first impurity diffusion layer 107. The epitaxial barrier layer is removed from the peripheral circuit region "B", by etching. In some embodiments according to the invention, the epitaxial barrier layer is made of a material having an etch selectivity with respect to the first and second stack barrier, layers 104 and 204 and the spacer 108.

Figure 5:
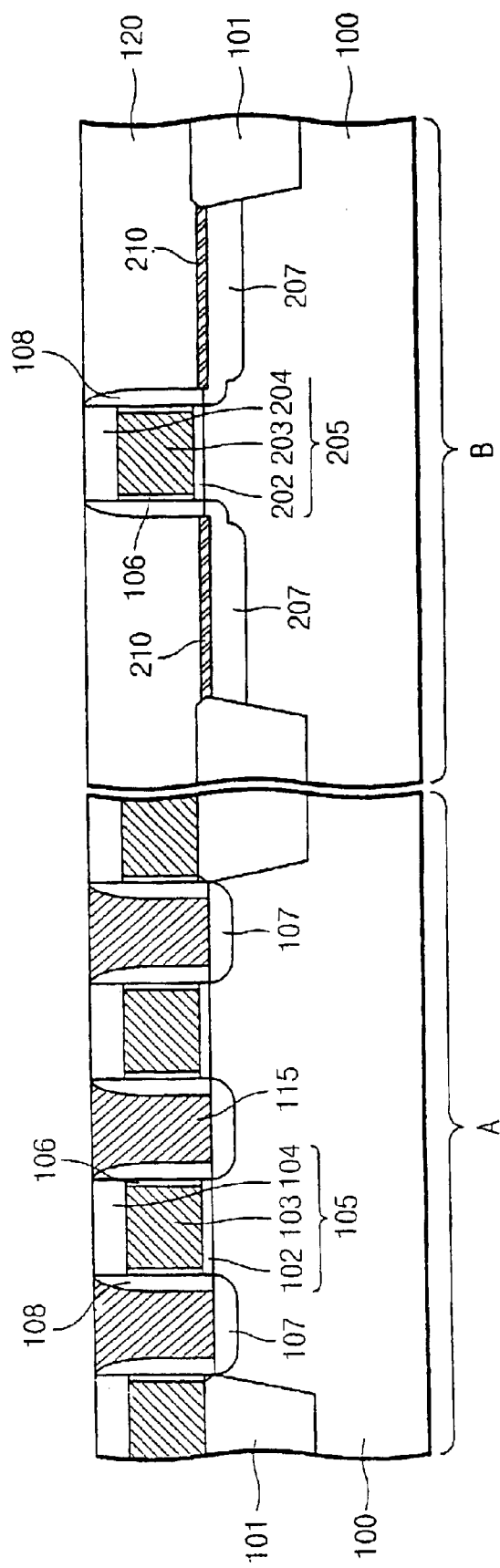

Referring to FIG. 5, an interlayer dielectric 120 is formed on the surface of the integrated circuit substrate 100 including the epitaxial layer 115. In some embodiments according to the invention, the interlayer dielectric 120 is silicon oxide. The interlayer dielectric 120 is planarized to expose the epitaxial layer 115 and the first and second stack barrier layers 104 and 204.

Figure 6:
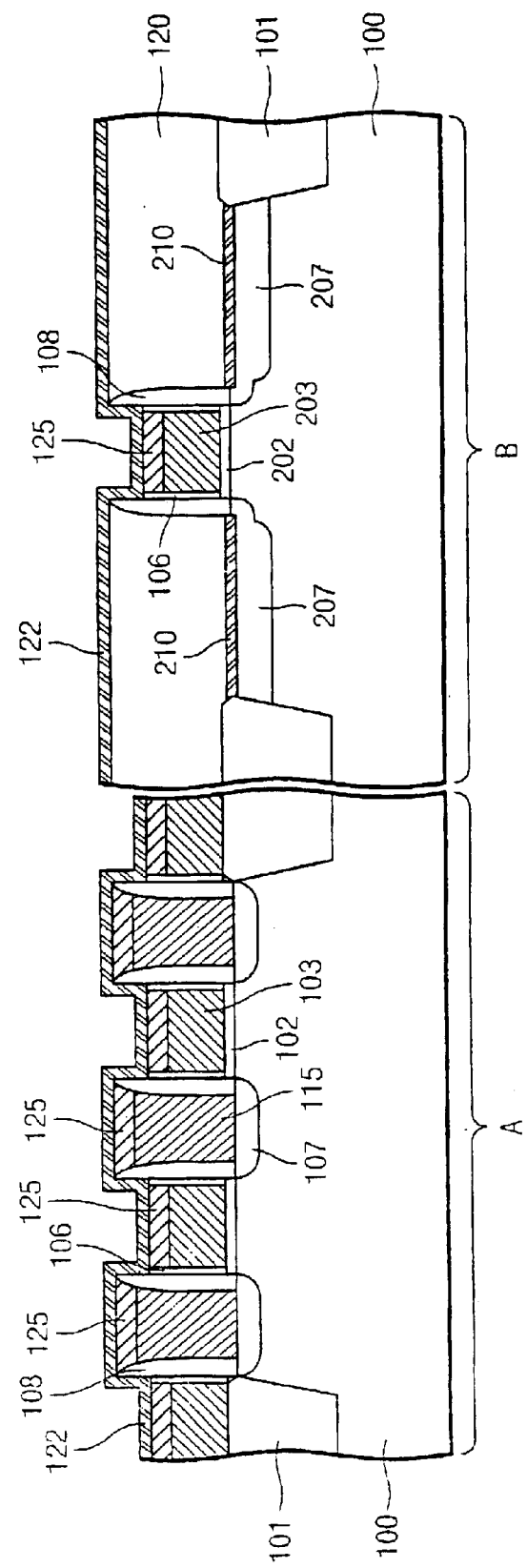

Referring to FIG. 6, the exposed first and second stack barrier layers 104 and 204 are anisotropically etched to expose top surfaces of the first and second gate electrodes 103 and 203 to reduce the respective levels to beneath the level of the epitaxial layer 115. A metal layer 122 is formed on the exposed first and second gate electrodes 103 and 203 and the exposed epitaxial layer 115. In some embodiments according to the invention, the metal layer 122 is at least one material selected from the group consisting of cobalt (Co), titanium (Ti), and nickel (Ni). The metal layer 122 is silicided to form a metal silicide layer 125 on the epitaxial layer 115 and on the first and second gate electrodes 103 and 203. In some embodiments according to the invention, the metal silicide layer 125 is cobalt silicide ($CoSi_x$), titanium silicide ($TiSi_x$) or nickel silicide ($NiSi_x$).

In some embodiments according to the invention, it is possible to form a metal silicide layer which is not deteriorated by a gate thermal oxidation process. Because the metal silicide layer 125 is formed after the gate thermal oxidation process, it is not deteriorated by the gate thermal oxidation process. Accordingly, an increase in resistance may be avoided or reduced. Furthermore, the metal silicide layer 125 may be simultaneously formed on the first gate electrode 103 and the epitaxial layer 115 in the cell region "A" and on the second gate electrode 203 in the peripheral circuit region "B".

Figure 7:
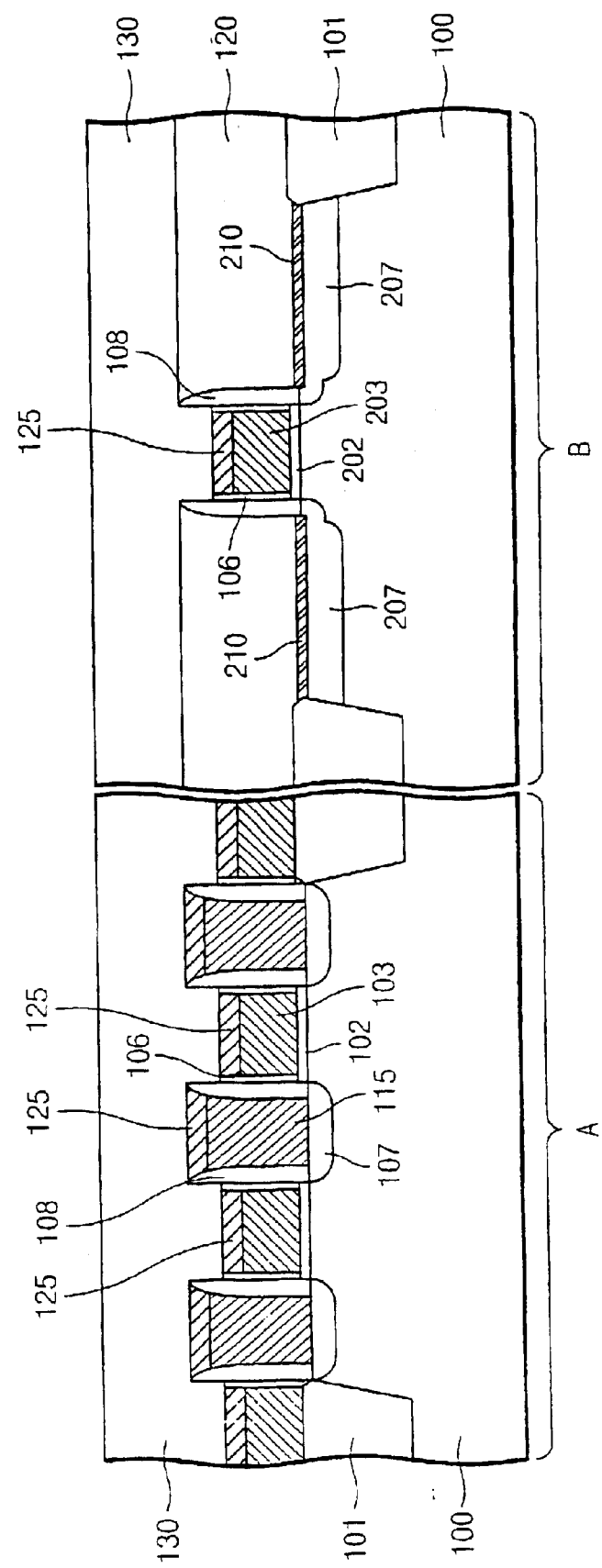
Figure 8:
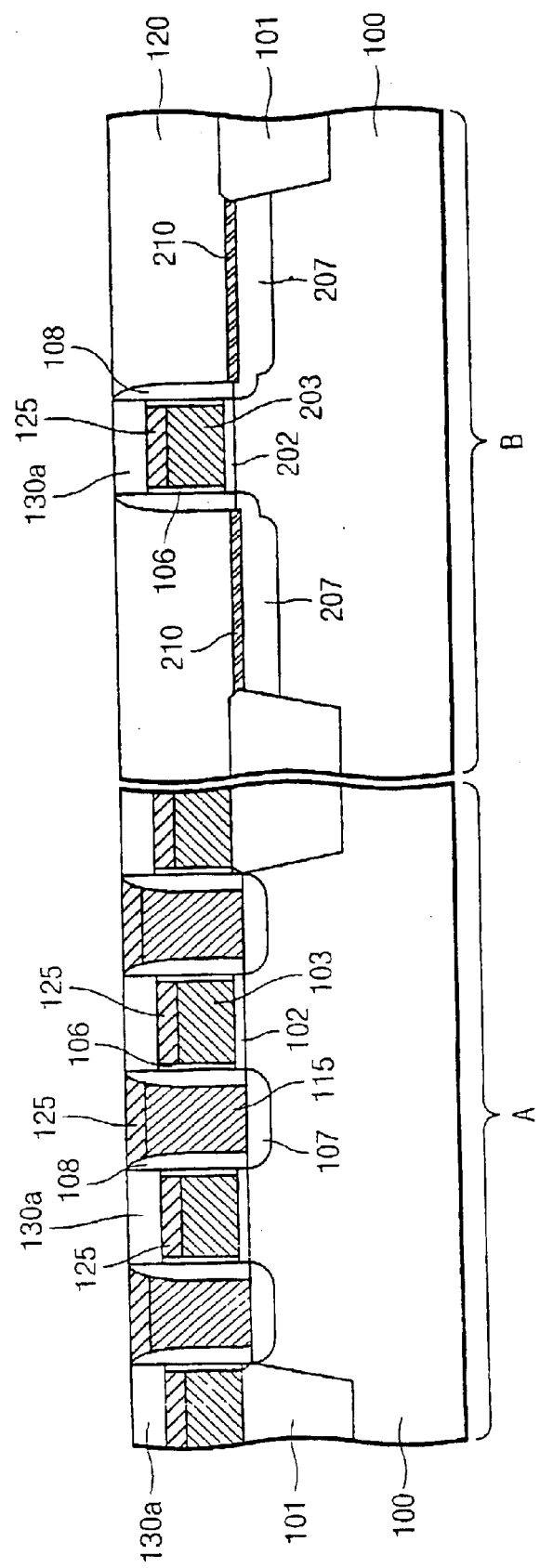

Referring to FIG. 7, the remaining metal layer 122 is removed to expose the metal silicide layer 125 and the interlayer dielectric 120. A capping layer 130 is formed on the exposed metal silicide layer 125. In some embodiments according to the invention, the capping layer 130 is silicon nitride. Referring to FIG. 8, the capping layer 130 is planarized to a top surface of the metal silicide layer 125 to form a capping pattern 130a on the first and second gate electrodes 103 and 203. In some embodiments according to the invention, the surfaces of the epitaxial layer 115 and the first and second gate electrodes 103 and 203 are exposed by chemical mechanical polishing (CMP).

Figure 9:
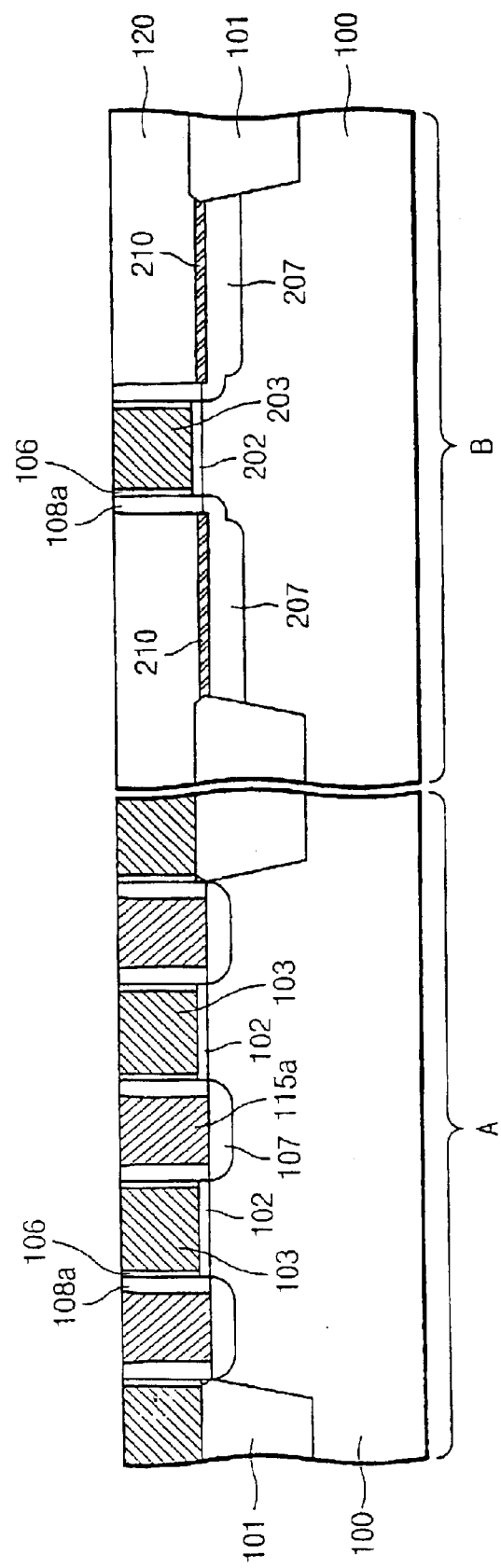
Figure 10:
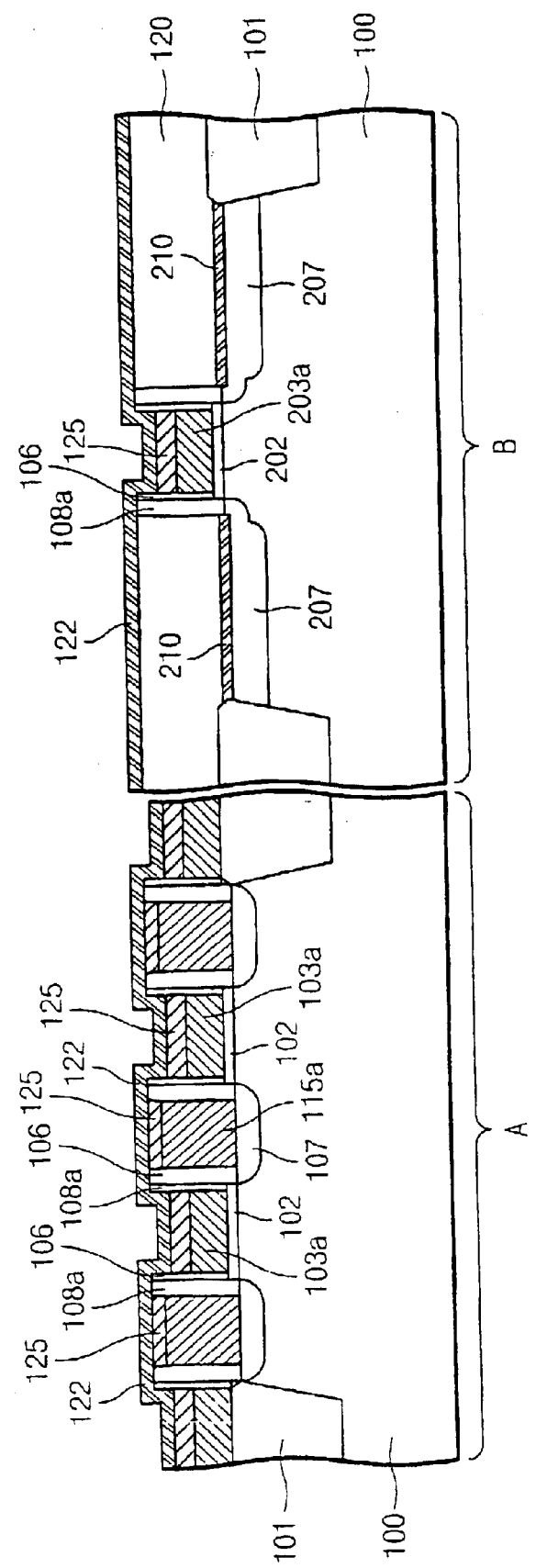

FIG. 9 and FIG. 10 illustrate method embodiments of forming integrated circuit devices according the invention. In particular, the top surfaces of the epitaxial layer, the first gate electrode, and the second gate electrode is now described below with reference to FIGS. 9 and 10. As shown in FIG. 9, the interlayer dielectric 120, shown in FIG. 4, the epitaxial layer 115, the first and second stack barrier layers 104 and 204, and the spacer 108 are planarized to expose surfaces of the first and second gate electrodes 103 and 203 and to form a planarized epitaxial layer 115a and a planarized spacer 108a.

Referring to FIG. 10, the integrated circuit substrate 100, including the exposed top surfaces of the planarized epitaxial layer 115a and the first and second gate electrodes 103 and 203, are subjected to a thermal desorption silicon etch to form recessed gate electrodes 103a and 203a. In the thermal desorption silicon etch, there is a difference between an etch rate of a single crystalline silicon layer and an etch rate of a polysilicon layer. In particular, the etch rate of the planarized epitaxial layer 115a can be greater than that of the first and second gate electrodes 103 and 203. Thus, the top surfaces of the first and second gate electrodes 103a and 203a are recessed relative to the top surfaces of the planarized epitaxial layer 115a.

As discussed above in reference to embodiments illustrated by FIG. 6, a metal silicide layer 125 is formed on the planarized epitaxial layer 115a and on the recessed first and second gate electrodes 103a and 203a. Subsequent processes are performed as discussed above in reference to embodiments illustrated by FIGS. 7 and 8. In the drawings and specification, there have been disclosed typical preferred embodiments of the invention and, although specific terms are employed, they are used in a generic and descriptive sense only and not for purposes of limitation, the scope of the invention being set forth in the following claims.

What is claimed:

1. A method of forming an integrated circuit device comprising:
   forming a gate electrode on an integrated circuit substrate;
   forming a thermal oxide layer on a side wall of the gate electrode using a thermal oxidation process;
   forming a source/drain region associated with the gate electrode;
   epitaxially growing a conductive layer on the source/drain region to provide a raised source/drain conductive layer above the source/drain region;
   exposing a surface of the gate electrode at a level below the raised source/drain conductive layer; and
   forming a silicide layer on the exposed surface of the gate electrode.

2. A method according to claim 1 wherein the step of forming a silicide layer is preceded by:
   forming a spacer on the thermal oxide layer so that the thermal oxide layer is between the side wall and the spacer.

3. A method according to claim 1 further comprising:
   siliciding the raised source/drain conductive layer to provide a raised silicide layer on the source/drain conductive region.

4. A method according to claim 3 further comprising:
   removing a barrier layer from the gate electrode to expose a surface of the gate electrode at a level below the raised conductive layer; and
   siliciding the exposed surface of the gate electrode to form the raised silicide layer on the gate electrode.

5. A method according to claim 4 wherein the raised silicide layer comprises a first raised silicide layer in a cell region of the integrated circuit device, wherein the method further comprises:
   forming a second silicide layer on a source/drain region associated with a gate electrode in a peripheral region of the integrated circuit device.

6. A method according to claim 4 further comprising:
   forming a capping layer on the raised silicide layer on the gate electrode to a level about equal to the level of the raised silicide layer on the source/drain region.

7. A method according to claim 1 further comprising:
   forming a source/drain region associated with the gate electrode;
   forming a conductive layer on the source/drain region to provide a raised source/drain conductive layer above the source/drain region;
   planarizing the gate electrode, the raised source/drain conductive layer and the thermal oxide layer; and
   siliciding the raised conductive layer to provide a raised silicide layer on the source/drain region.

8. A method according to claim 1 further comprising:
   forming a gate insulating layer on the substrate beneath the gate electrode, wherein the gate insulating layer extends beyond the side wall to provide a step surface of the gate insulating layer that faces opposite the substrate; and
   wherein the thermal oxide layer is formed on the side wall and on the step surface.

9. A method of forming an integrated circuit device comprising:
   forming a gate electrode on an integrated circuit substrate;
   forming a barrier layer on the gate electrode;
   forming a thermal oxide layer on a side wall of the gate electrode using a thermal oxidation process;
   forming a source/drain region self-aligned to the gate electrode;
   forming a spacer on the thermal oxide layer so that the thermal oxide layer is between the side wall and the spacer;
   epitaxially growing a conductive layer on the source/drain region to provide a raised source/drain conductive layer above the source/drain region;
   removing the barrier layer from the gate electrode to expose a surface of the gate electrode at a level below the raised conductive layer;
   forming a metal layer on the exposed surface of the gate electrode and on the raised conductive layer; and siliciding the metal layer to form a raised silicide layer on the gate electrode and on the raised source/drain conductive layer.

10. A method according to claim 9 wherein the metal layer comprises at least one selected from the group consisting of cobalt (Co), titanium (Ti), and nickel (Ni).

11. A method of forming a semiconductor device, comprising:
(a) forming a device isolation layer at a semiconductor substrate to define an active region;
(b) forming a gate pattern crossing the active region, the gate pattern including a gate insulating layer, a gate electrode, and a stack barrier layer which are sequentially stacked;
(c) forming a gate thermal oxide layer on both sidewalls of the gate electrode;
(d) forming a spacer on both sidewalls of a gate pattern having the gate thermal oxide layer;
(e) forming an epitaxial layer on an active region adjacent to opposite sides of a gate pattern having the spacer, the epitaxial layer being even with or higher than the stack barrier layer;
(f) etching the stack barrier layer to expose a top surface of the gate electrode; and
(g) forming a metal silicide layer at the exposed gate electrode and the epitaxial layer,
wherein the stack barrier layer serves to prevent formation of the epitaxial layer on the gate electrode and is made of a material having an etch selectivity with respect to the gate electrode.

12. The method as claimed in claim 11, wherein the gate electrode is made of doped polysilicon.

13. The method as claimed in claim 11, wherein the stack barrier layer is made of silicon oxide or silicon nitride.

14. The method as claimed in claim 11, wherein the stack barrier layer is anisotropically etched to expose the top surface of the gate electrode.

15. The method as claimed in claim 11, wherein the (f) comprises:
planarizing the epitaxial layer, the spacer, and the stack barrier layer by means of chemical mechanical polishing (CMP) to expose the top surface of the gate electrode; and
recessing the exposed gate electrode wherein the metal silicide layer is formed on the planarized epitaxial layer and the recessed gate electrode.

16. The method as claimed in claim 15, wherein the exposed gate electrode is recessed by means of a thermal desorption silicon etch where an etch rate of the gate electrode is higher than that of the epitaxial layer.

17. The method as claimed in claim 11, wherein the (g) comprises:
conformally forming a metal layer on an entire surface of a semiconductor substrate including the exposed top surface of the gate electrode;
siliciding a semiconductor substrate including the metal layer to form the metal silicide layer on the gate electrode and the epitaxial layer; and
removing the metal layer.

18. The method as claimed in claim 17, wherein the metal layer is made of at least one selected from the group consisting of cobalt (Co), titanium (Ti), and nickel (Ni).

19. The method as claimed in claim 11, after forming the metal silicide layer, further comprising:
forming a capping layer on an entire surface of a semiconductor substrate including the metal silicide layer; and
planarizing the capping layer down to a top surface of the metal silicide layer on the epitaxial layer to form a capping layer pattern on the metal silicide layer on the gate electrode.

20. A method of forming a semiconductor device, comprising:
(a) preparing a semiconductor substrate including a cell region with a first active region and a peripheral circuit region with a second active region;
(b) forming a first gate pattern crossing the first active region and a second gate pattern crossing the second active region, the first gate pattern including a first gate insulating layer, a first gate electrode, and a first stack barrier layer which are sequentially stacked, and the second gate pattern including a second gate insulating layer, a second gate electrode, and a second stack barrier layer which are sequentially stacked;
(c) forming a gate thermal oxide layer on both sidewalls of the first and second gate electrodes;
(d) forming a spacer on both sidewalls of first and second gate patterns having the gate thermal oxide layer;
(e) forming an epitaxial layer on a first active region adjacent to opposite sides of a first gate pattern having the spacer, the epitaxial layer being even with or higher than a top surface of the first stack barrier layer;
(f) forming an interlayer dielectric on an entire surface of a semiconductor substrate including the epitaxial layer;
(g) etching the interlayer dielectric and the first and second stack barrier layers to expose top surfaces of the epitaxial layer and the first and second gate electrodes; and
(h) forming a metal silicide layer at the exposed epitaxial layer and the exposed first and second gate electrodes,
wherein the first and second stack barrier layers serve to prevent formation of the epitaxial layer on the first and second gate electrodes and are made of materials having an etch selectivity with respect to the first and second gate electrodes, respectively.

21. The method as claimed in claim 20, wherein the first and second gate electrodes are made of doped polysilicon.

22. The method as claimed in claim 20, wherein the first and second stack barrier layers are made of silicon nitride or silicon oxide.

23. The method as claimed in claim 20, before forming the epitaxial layer, further comprising:
forming a silicide barrier layer on an entire surface of a semiconductor substrate including the spacer;
removing the silicide barrier layer formed in the peripheral circuit region; and
forming an ohmic layer on a surface of the second active region adjacent to opposite sides of the second gate pattern where the silicide barrier layer is removed,
wherein the silicide barrier layer is made of a material having an etch selectivity with respect to the first and second stack barrier layers and the spacer.

24. The method as claimed in claim 23, wherein the ohmic layer is made of one selected from the group consisting of cobalt silicide (CoSix), titanium silicide (TiSix), and nickel silicide (NiSix).

25. The method as claimed in claim 20, wherein the (g) comprises:
planarizing the interlayer dielectric down to top surfaces of the epitaxial layer and the first and second stack barrier layers; and
anisotropically etching the first and second stack barrier layers to expose the top surfaces of the first and second gate electrodes.

26. The method as claimed in claim 20, wherein the (g) comprises:

planarizing the interlayer dielectric, the epitaxial layer, the spacer and the first and second stack barrier layers by means of chemical mechanical polishing (CMP) to expose top surfaces of the epitaxial layer and the first and second gate electrodes; and recessing the exposed first and second gate electrodes, wherein the metal silicide layer is formed on the planarized epitaxial layer and the recessed first and second gate electrodes.

27. The method as claimed in claim 26, wherein the first and second gate electrodes are recessed by means of a thermal desorption silicon etch where an etch rate of the first and second gate electrodes is higher than that of the epitaxial layer.

28. The method as claimed in claim 20, wherein the (h) comprises:

conformally forming a metal layer on an entire surface of a semiconductor substrate including the top surfaces of the exposed epitaxial layer and the exposed first and second gate electrodes;

siliciding a semiconductor substrate including the metal layer to form a metal silicide layer on the epitaxial layer and the first and second gate electrodes; and removing the metal layer.

29. The method as claimed in claim 28, wherein the metal layer is made of at least one selected from the group consisting of cobalt (Co), titanium (Ti), and nickel (Ni).

30. The method as claimed in claim 20, after forming the metal silicide layer, further comprising:

forming a capping layer on an entire surface of a semiconductor substrate including the metal silicide layer; and planarizing the capping layer down to a top surface of the metal silicide layer on the epitaxial layer to form a first capping layer pattern on the metal silicide layer disposed on the first gate electrode and to form a second capping layer pattern on the metal silicide layer disposed on the second gate electrode.

* * * * *

UNITED STATES PATENT AND TRADEMARK OFFICE
CERTIFICATE OF CORRECTION

PATENT NO. : 6,890,823 B2
DATED : May 10, 2005
INVENTOR(S) : Lee et al.

It is certified that error appears in the above-identified patent and that said Letters Patent is hereby corrected as shown below:

Title page, Item [54] and Column 1, lines 1-6,
Title, should read -- METHODS OF FORMING INTEGRATED CIRCUITS WITH THERMAL OXIDE LAYERS ON SIDE WALLS OF GATE ELECTRODES --.

Signed and Sealed this

Twenty-second Day of November, 2005

JON W. DUDAS
*Director of the United States Patent and Trademark Office*